US009908979B2

United States Patent
Baek et al.

(10) Patent No.: US 9,908,979 B2
(45) Date of Patent: Mar. 6, 2018

(54) POLYTHIOPHENE STAR COPOLYMER CAPABLE OF BEING SELF-DOPED BY EXTERNAL STIMULUS, A METHOD FOR PRODUCING THE SAME, A CONDUCTIVE THIN FILM USING THE SAME, AND A METHOD FOR PRODUCING THE CONDUCTIVE THIN FILM

(71) Applicant: KOREA INSTITUTE OF SCIENCE AND TECHNOLOGY, Seoul (KR)

(72) Inventors: Kyung Youl Baek, Seoul (KR); Seung Sang Hwang, Seoul (KR); Soon Man Hong, Seoul (KR); Min Jae Ko, Cheonan-si (KR); Yun Jae Lee, Ansan-si (KR); Hyun Ji Kim, Seoul (KR); Hyeon Yeol Jeon, Busan (KR); Chong Min Koo, Goyang-si (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 290 days.

(21) Appl. No.: 14/395,108

(22) PCT Filed: Mar. 15, 2013

(86) PCT No.: PCT/KR2013/002112
§ 371 (c)(1),
(2) Date: Oct. 17, 2014

(87) PCT Pub. No.: WO2013/157741
PCT Pub. Date: Oct. 24, 2013

(65) Prior Publication Data
US 2015/0203639 A1  Jul. 23, 2015

(30) Foreign Application Priority Data
Apr. 18, 2012 (KR) .................... 10-2012-0040216

(51) Int. Cl.
*C08J 3/24* (2006.01)
*C08G 61/12* (2006.01)
*C09D 165/00* (2006.01)
*H01L 51/00* (2006.01)

(52) U.S. Cl.
CPC ............ *C08J 3/246* (2013.01); *C08G 61/126* (2013.01); *H01L 51/0043* (2013.01); *C08G 2261/131* (2013.01); *C08G 2261/1412* (2013.01); *C08G 2261/1452* (2013.01); *C08G 2261/3223* (2013.01); *C08G 2261/354* (2013.01); *C08G 2261/51* (2013.01); *C08G 2261/74* (2013.01); *C08J 2365/00* (2013.01); *C09D 165/00* (2013.01); *H01L 51/0036* (2013.01); *Y10T 428/31533* (2015.04)

(58) Field of Classification Search
None
See application file for complete search history.

(56) References Cited

U.S. PATENT DOCUMENTS 9,546,226 B2 * 1/2017 Goto .................... C08F 4/40
2008/0248313 A1 * 10/2008 Seshadri ............. C08G 61/126
428/419

FOREIGN PATENT DOCUMENTS

| KR | 1998-032807 | 7/1998 |
| KR | 10-2010-0118509 | 11/2010 |
| KR | 2010118509 A * | 11/2010 |
| KR | 10-2011-0023650 | 3/2011 |
| WO | WO 2011/015993 A2 * | 2/2011 |
| WO | WO 2011/016166 A1 * | 2/2011 |

OTHER PUBLICATIONS

Yijie Xia et al., "PEDOT:PSS films with significantly enhanced conductivities induced by preferential solvation with cosolvents and their application in polymer photovoltaic cells", Journal of Materials Chemistry, 2011, vol. 21, pp. 4927-4936.
C.W.T. Bulle-Lieuwma et al., "Characterization of polymer solar cells by TOP-SIMS depth profiling", Applied surface Science, 2003, pp. 547-550.
Mi-Ri Choi et al., "Soluble Self-Doped Conducting Polymer Compositions with Tunable Work Function as Hole Injection/Extraction Layers in Organic Optoelectronics", Angew. Chem., 2011, vol. 123, pp. 6398-6401.
Hyun-Ji Kim et al., "Synthesis of Multiarmed Poly(3-hexyl thiophene) Star Polymer with Microgel Core by GRIM and ATRP Methods", Journal of Polymer Science part A: Polymer Chemistry, 2011, vol. 49, pp. 4221-4226.
Kyung Hwan Kim et al., "Soluble Star-Shaped Molecules Based on Thiophene Derivatives as Organic Semiconductors for Field-Effect Transistor Applications", Chem. Mater., 2007, vol. 19, pp. 4925-4932.
Tyler Taerum et al., "Synthesis, Polymerization, and Unusual Properties of New Star-Shaped Thiophene Oligomers", Organic Letters, 2009, vol. 11, No. 15, pp. 3230-3233.

* cited by examiner

*Primary Examiner* — Lorna M Douyon
(74) *Attorney, Agent, or Firm* — Goldilocks Zone IP Law (57) ABSTRACT

The present invention provides a method for producing polythiophene star copolymer capable of being self-doped by an external stimulus, which includes the steps of: forming a polythiophene macroinitiator made by introducing a living radical polymerizable functional group into an end of polythiophene or a derivative thereof; forming through living radical polymerization a polymer macroinitiator for providing by an external stimulus at least a dopant selected from the group consisting of sulfonic acid radical, carboxylic acid radical and phosphoric acid radical; and polymerizing the polythiophene macroinitiator added with the polymer macroinitiator and at least one kind of divinyl monomer to produce the polythiophene star copolymer. The polythiophene star copolymer capable of being self-doped by an external stimulus according to the present invention is a self-doped material to stably increase conductivity, and can be used as a material for a conductive film.

9 Claims, 6 Drawing Sheets

POLYTHIOPHENE STAR COPOLYMER CAPABLE OF BEING SELF-DOPED BY EXTERNAL STIMULUS, A METHOD FOR PRODUCING THE SAME, A CONDUCTIVE THIN FILM USING THE SAME, AND A METHOD FOR PRODUCING THE CONDUCTIVE THIN FILM

CROSS REFERENCE TO RELATED APPLICATIONS

This application claims the benefit of International Application No. PCT/KR2013/002112, filed Mar. 15, 2013, and claims the benefit of Korean Application No. 10-2012-0040216, filed Apr. 18, 2012, the disclosures of all of which are incorporated herein by reference.

TECHNICAL FIELD

The present disclosure relates to a polythiophene star copolymer capable of being self-doped by an external stimulus, a method for producing the same, a conductive thin film using the same and a method for producing the conductive thin film. More particularly, the present disclosure relates to a polythiophene star copolymer capable of being self-doped by an external stimulus, obtained by linking regioregular polythiophene polymer and a polymer for providing a dopant, having a sulfonic acid group, a carboxylic acid group or an acrylic acid group to a microgel core, a method for producing the same, a conductive thin film using the same and a method for producing the conductive thin film.

BACKGROUND ART

Polythiophene has many potential applications including organic solar cells, smart window systems, organic light-emitting diodes (OLEDs), transparent electrodes, antistatic agents, etc.

Although polythiophene-based conductive polymers are generally synthesized by a metal-catalyzed crosslinking reaction, the Grignard metathesis (GRIM) method provides greatly improved electronic and optical properties as compared to the existing random regioisomeric analogues owing to the high regioregularity of the polythiophene side chains arranged head-to-tail (HT).

It is known that the synthesis of polythiophene-based conductive polymers by the GRIM method allows control of not only regioregularity but also molecular weight and molecular weight distribution to some extent, which can be achieved through quasi-living polymerization of thiophene. Living polymerization is advantageous in that molecular weight can be predicted from the amount of monomers and initiator used because of fewer side reactions such as termination during the polymerization, and that, since the obtained polymer has a narrow molecular weight distribution and has living ends (livingness), the molecular weight can be increased further by adding more monomers. Accordingly, the method can be used to synthesize block copolymers. In the GRIM method, a Ni(II) catalyst is used as an initiator to control the molecular weight. Depending on the type of initiator used, living polymerization is classified into living radical polymerization, living anionic polymerization and living cationic polymerization.

In general, a star polymer refer to polymer having a three-dimensional structure wherein several linear polymer chains are connected to a central core by chemical bonding. When compared with linear polymer having the same molecular weight, a star polymer exhibits very low viscosity and very superior solubility because of compact structure and small hydrodynamic volume.

In general, conductive polymers like polythiophene are difficult to be synthesized with a large molecular weight because of poor solubility resulting from a rigid structure wherein aromatic compounds or olefin compounds having resonance structure are connected to a main chain. Although solubility has been increased by introducing soluble alkane groups to the side chains to overcome this problem, the insulating alkane groups disadvantageously lead to decrease in conductivity resulting from the main chain having the resonance structure.

Whereas synthesis and physical properties of linear polythiophenes having two-dimensional structure have been researched, there have been few researches on the synthesis and physical properties of polythiophenes having three-dimensional structure such as star polymers.

In general, polythiophene exhibits very low electron mobility ($10^{-8}$ S/cm) in the absence of a dopant. When doped through oxidation or reduction, the electron mobility of polythiophene is increased to about $10^2$ S/cm. At present, PEDOT:PSS using polystyrene sulfonate is the representative dopant used for polythiophenes and it is widely used, for example, in a buffer layer (hole transfer layer) of an organic solar cell. Although PEDOT:PSS is advantageous to laminate organic materials because it is dispersed in water, it has processability problem because it is not soluble in organic solvents. In addition, the presence of a water-absorbing layer negatively affects device performance in the long term.

DISCLOSURE

Technical Problem

The present disclosure is directed to providing a polythiophene star copolymer capable of being self-doped by an external stimulus, obtained by reacting regioregular polythiophene as a conductive polymer with a polymer for providing by an external stimulus at least one dopant selected from a group consisting of a sulfonic acid group, a carboxylic acid group and a phosphoric acid group using a crosslinking agent, thereby preparing a polymer having a three-dimensional structure connected to a microgel core formed by the crosslinking agent, which has high solubility in organic solvents at normal times but is not dissolved in any solvent during film formation as a hydrophilic dopant is generated by an external stimulus, thereby exhibiting improved resistance in the following solution process and exhibiting excellent conductivity owing to the dopant, and a method for producing the same.

Technical Solution

In an aspect, the present disclosure provides a method for producing a polythiophene star copolymer capable of being self-doped by an external stimulus, including:

forming a polythiophene macroinitiator made by introducing a living radical polymerizable functional group into an end of polythiophene or a derivative thereof;

forming through living radical polymerization a polymer macroinitiator for providing by an external stimulus at least one dopant selected from a group consisting of a sulfonic acid group, a carboxylic acid group and a phosphoric acid group; and polymerizing the polythiophene macroinitiator added with the polymer macroinitiator and at least one kind of divinyl monomer to produce the polythiophene star copolymer, wherein the polythiophene star copolymer includes: a microgel core including a homopolymer of a divinyl monomer or a copolymer of two or more divinyl monomers; polythiophene or a derivative thereof bonded to the core; and a hetero arm chain including a polymer providing by an external stimulus at least one dopant selected from a group consisting of a sulfonic acid group, a carboxylic acid group and a phosphoric acid group.

In another aspect, the present disclosure provides a method for producing a conductive thin film using a polythiophene star copolymer capable of being self-doped by an external stimulus, including:

forming a conductive thin film using a polythiophene star copolymer prepared by the method comprising:

forming a polythiophene macroinitiator made by introducing a living radical polymerizable functional group into an end of polythiophene or a derivative thereof:

forming through living radical polymerization a polymer macroinitiator for providing by an external stimulus at least one dopant selected from a group consisting of a sulfonic acid group, a carboxylic acid group and a phosphoric acid group: and polymerizing the polythiophene macroinitiator added with the polymer marcroinitiator and at least one kind of divinyl monomer to produce the polythiophhene star copolymer.

wherein the polythiophene star copolymer comprises: a microgel core comprising a homopolymer of a divinyl monomer or a copolymer of two or more divinyl monomers: polythiophene or a derivative thereof bonded to the core: and a hetero arm chain comprising a polymer providing by an external stimulus at least one dopant selected from a group consisting of a sulfonic acid group, a carboxylic acid group and a phosphodric acid group on a substrate; and applying an external stimulus to the substrate by post-treating with at least one selected from heat, light and an acidic chemical.

Advantageous Effects

In accordance with the present disclosure, a polythiophene star copolymer including a high-molecular-weight polythiophene having a three-dimensional structure and a polymer capable of providing by an external stimulus at least one dopant selected from a sulfonic acid group, a carboxylic acid group and a phosphoric acid group can be prepared. The polythiophene star copolymer provided by the present disclosure exhibits superior solubility and a film formed after coating exhibits high conductivity as a dopant is spontaneously generated by the polymer providing by an external stimulus at least one dopant selected from a sulfonic acid group, a carboxylic acid group and a phosphoric acid group and dopes the polythiophene. In addition, since the generated dopant is hydrophilic, the film exhibits high solvent resistance due to decreased solubility in organic solvents. Accordingly, the polythiophene star copolymer according to the present disclosure is a self-doped material to stably increase conductivity, and can be used as a material for a conductive film.

BEST MODE

Hereinafter, specific exemplary embodiments the present disclosure will be described in detail so that those of ordinary skill in the art to which the present disclosure belongs can easily carry out the present disclosure.

In accordance with a method for producing a polythiophene star copolymer capable of being self-doped by an external stimulus according to the present disclosure, the polymerization yield and type of a polythiophene star polymer can be controlled with the amount of a polythiophene macroinitiator, a macroinitiator capable of providing by at least one external stimulus at least one dopant selected from a sulfonic acid group, a carboxylic acid group and a phosphoric acid group and at least one divinyl monomer. Also, polythiophene star copolymers having pores of various sizes can be prepared.

A method for producing a polythiophene star copolymer capable of being self-doped by an external stimulus according to the present disclosure includes forming a polythiophene macroinitiator made by introducing a living radical polymerizable functional group into an end of polythiophene or a derivative thereof.

The polythiophene or polythiophene derivative is synthesized from polymerization of a thiophene monomer. The thiophene monomer may be synthesized from substitution with an alkyl group, an alkoxy group, etc. at three positions. Alternatively, it may have a ring structure with or without a heteroatom. The heteroatom may be C or O.

The polythiophene or polythiophene derivative may be represented by Chemical Formula 1.

[Chemical Formula 1]

In Chemical Formula 1, n is an integer from 0 to 12 and m is an integer from 1 to 90.

The polythiophene or polythiophene derivative may also be Chemical Formula 2 or Chemical Formula 3.

[Chemical Formula 2]

In chemical formula 2, m is an integer form 1 to 90, is $-C_nH_{2n+1}$ and n is an integer from 1 to 12.

[Chemical Formula 3]

In chemical formula 3, m is an integer from 1 to 90, R1 and R2 are selected from the R in chemical formula 2, and R1 and R2 may be identical or different.

In Chemical Formula 3, the $R_1$ and $R_2$ may be selected from the R and may have a ring structure with or without a heteroatom. The heteroatom may be N or O.

Also, the polythiophene derivative may be, for example, poly(3-alkylthiophene) substituted with an alkyl group at 3-position of polythiophene and the solubility of the poly (3-alkylthiophene) can be controlled with the number of carbon atoms of the alkyl group. In addition, the polythiophene derivative may be poly(3-alkoxythiophene), or the like.

The polythiophene macroinitiator refers to a polythiophene or a polythiophene derivative compound to which a functional group capable of initiating polymerization of the polythiophene star polymer has been introduced.

In an exemplary embodiment, the step of forming the polythiophene macroinitiator may include: forming an allyl group or a vinyl group at an end of polythiophene; introducing a hydroxyl group to the end of the polythiophene at which the allyl group or the vinyl group has been formed; and replacing the hydroxyl group with at least one selected from a group consisting of a halide compound, benzyl 3-chloro-3-oxopropyl carbonotrithioate, 2-bromo-2-methylpropanoyl bromide and 2,2,5-trimethyl-4-phenyl-3-azahexane-3-oxy (TINPO).

The allyl group or the vinyl group may be formed at the end of polythiophene by, for example, Grignard metathesis (GRIM). By employing the GRIM method, a variety of nonpolar groups such as an allyl group, an alkane group, an alkyne group, a benzene group, etc. may be introduced to the end of a chain using different Grignard reagents.

Then, after introducing the hydroxyl group to the end of the polythiophene at which the allyl group or the vinyl group has been formed, a polythiophene macroinitiator selected from a group consisting of a nitroxide-mediated polymerization (NMP) macroinitiator, a reversible addition-fragmentation chain transfer (RAFT) macroinitiator and an atom transfer radical polymerization (ATRP) macroinitiator may be prepared by adequately replacing the hydroxyl group.

In an exemplary embodiment, an atom transfer radical polymerization (ATRP) macroinitiator may be formed by replacing the hydroxyl group with a halide compound. In this case, a halogen atom of the halide compound may serve as an initiation site of atom transfer radical polymerization.

The halide compound is not specially limited as long as it has a living radical polymerizable functional group. For example, it may be at least one compound selected from a group consisting of 4-methylbenzyl bromide, 4-cyanobenzyl bromide, 4-bromobenzyl bromide, 2-bromopropionitrile, bromoacetonitrile, glycidol 2-bromopropionate, tert-butyl 2-bromopropionate, hydroxyethyl 2-bromopropionate, vinyl chloroacetate, allyl chloroacetate, α-bromo-γ-butyrolactone, 2-chloroacetamide, ethyl 2-chloro-2-phenyl acetate (ECPA), 2-bromoacetyl bromide, 2-chloroacetyl chloride, 2-bromopropanoyl bromide, 2-chloropropanoyl chloride, 2-bromo-2-methylpropanoyl bromide, 2-chloro-2-methylpropanoyl chloride, 2-bromo-2-phenylacetyl bromide and 2-chloro-2-phenylacetyl chloride.

The polythiophene star copolymer may be prepared by ATRP as the polythiophene macroinitiator including the halide compound is activated by heat in the presence of a catalyst. A radical may be formed as a bonding between a carbon atom and a halogen atom of the halide compound forms a complex by the catalyst.

For example, the catalyst may be a transition metal catalyst CuX (X=Cl or Br). When the CuX (X=Cl or Br) is used as the catalyst, it is not necessary to add an additional compound. However, at least one ligand selected from 2,2'-bipyridine and a derivative thereof, 2-iminopyridine and an aliphatic polyamine may be further added during the polymerization of the polythiophene star copolymer, and the rate of reaction may be changed depending on the combination of the catalyst and the ligand.

The transition metal catalyst may be at least one selected from a group consisting of $RuCl_2(PPh_3)_3$, $RuH_2(PPh_3)_3$, $FeCl_2(PPh_3)_3$, $NiBr_2(PPh_3)_3$ and Ni(NCN)Br, although not being limited thereto.

When $RuCl_2(PPh_3)_3$ is used as the transition metal catalyst among them, the polythiophene star copolymer may be polymerized by further using at least one additive selected from a group consisting of tributylamine and dibutylamine. The additive may improve stability and reactivity when the polythiophene star polymer is polymerized.

In another exemplary embodiment, when the hydroxyl group is replaced with 2,2,5-trimethyl-4-phenyl-3-azahexane-3-oxy and/or 2-bromo-2-methylpropanoyl bromide, a polythiophene macroinitiator capable of nitroxide-mediated polymerization (NMP) as the living radical polymerization may be formed. The NMP allows stable polymerization since a radical is easily formed from the bonding between nitrogen and oxygen.

When the hydroxyl group is replaced with benzyl 3-chloro-3-oxopropyl carbonotrithioate, a polythiophene macroinitiator capable of reversible addition-fragmentation chain transfer (RAFT) polymerization as the living radical polymerization may be formed. The RAFT polymerization allows polymerization by forming a growing radical as an end group is transferred reversibly as it is attacked by a radical.

Then, a polymer macroinitiator providing by an external stimulus at least one dopant selected from a group consisting of a sulfonic acid group, a carboxylic acid group and a phosphoric acid group is formed through living radical polymerization.

The polymer macroinitiator may provide by an external stimulus at least one dopant selected from a group consisting of a sulfonic acid group, a carboxylic acid group and a phosphoric acid group.

The polymer macroinitiator is one polymerized from a monomer having one or more of a sulfonic acid group, a carboxylic acid group and a phosphoric acid group. Specifically, the monomer may be at least one selected from a group consisting of neopentyl styrene sulfonate, t-butyldimethyl (4-vinylphenyl) phosphonate, diethyl(4-vinylphenyl) phosphonate, di(t-butyl)-(4-vinylphenyl) phosphonate and t-butyl acrylate. In particular, it may be neopentyl styrene sulfonate.

The polymer macroinitiator may be one obtained by introducing at least one selected from a group consisting of an atom transfer radical polymerization (ATRP) macroinitiator, a nitroxide-mediated polymerization (NMP) macroinitiator and a reversible addition-fragmentation chain transfer (RAFT) macroinitiator into at least one selected from a group consisting of poly(neopentyl styrene sulfonate), poly (t-butyldimethyl(4-vinylphenyl) phosphonate), poly(diethyl (4-vinylphenyl) phosphonate), poly(di(t-butyl)(4-vinylphenyl) phosphonate) and poly(t-butyl acrylate).

Then, a polythiophene star copolymer is polymerized by adding the polymer macroinitiator and at least one divinyl monomer to the polythiophene macroinitiator.

The divinyl monomer serves as a crosslinking agent for forming a core having a crosslinked structure. Any crosslinking agent suitable for forming the structure can be used without particular limitation (hereinafter, the term divinyl monomer is interchangeable with the crosslinking agent). For example, the divinyl monomer may be at least one selected from a group consisting of an initiatable diacrylate compound, an initiatable dimethacrylate compound such as ethylene glycol dimethacrylate, an initiatable diacrylamide compound, an initiatable divinylphenyl compound, an initiatable divinylnaphthalene compound and an initiatable divinyltoluene compound.

Specifically, the step of polymerizing the star polymer may include: polymerizing a star copolymer including polythiophene and a sulfonic acid group, a carboxylic acid group and a phosphoric acid group by adding the polythiophene macroinitiator, the polymer having at least one of a sulfonic acid group, a carboxylic acid group and a phosphoric acid group and at least one divinyl monomer.

The present disclosure provides a polythiophene star copolymer including: a microgel core including a homopolymer of a divinyl monomer or a copolymer of two or more divinyl monomers; polythiophene or a derivative thereof bonded to the core; and a hetero arm chain including a polymer providing by an external stimulus at least one dopant selected from a group consisting of a sulfonic acid group, a carboxylic acid group and a phosphoric acid group.

The polymer providing at least one dopant selected from a group consisting of a sulfonic acid group, a carboxylic acid group and a phosphoric acid group may be one or more selected from a group consisting of poly(neopentyl styrene sulfonate), t-butyldimethyl(4-vinylphenyl) phosphonate, poly(diethyl(4-vinylphenyl) phosphonate), poly(di(t-butyl) (4-vinylphenyl) phosphonate) and poly(t-butyl acrylate). Specifically, it may be poly(neopentyl styrene sulfonate).

The divinyl monomer may be at least one selected from a group consisting of a diacrylate compound, an ethylene glycol dimethacrylate compound, a diacrylamide compound, a divinylphenyl compound, a divinylnaphthalene compound and a divinyltoluene compound.

The present disclosure also provides a method for producing a conductive thin film using the polythiophene star copolymer according to the present disclosure and the conductive thin film. The conductive thin film using the polythiophene star copolymer may be prepared by: forming a conductive thin film using a polythiophene star copolymer prepared by the method according to the present disclosure on a substrate; and applying an external stimulus to the substrate by post-treating with at least one selected from heat, light and an acidic chemical.

The substrate may be gold, $SiO_2$, etc., although not being limited thereto. The substrate may be surface-treated by at least one method selected from a group consisting of piranha solution treatment, acid treatment, base treatment, plasma treatment, atmospheric pressure plasma treatment, ozone treatment, UV treatment and polymer or single molecule coating.

In the step of forming the conductive thin film on the substrate, after introducing a functional group capable of coupling on the surface of the substrate, a polymer including polythiophene and at least one of a sulfonic acid group, a carboxylic acid group and a phosphoric acid group may be polymerized and then coated onto the surface through a coupling reaction.

The following post-treatment step may be at least one of heat treatment, light treatment and acidic chemical treatment. Specifically, the heat treatment may be performed at 150-250° C. Since an alkyl group of the polymer in the thin film is replaced with hydrogen through this post-treatment, the conductive thin film can be used as a self-doped conductive material. For example, the reaction formulas of post-treatment of poly(neopentyl styrene sulfonate), poly(t-butyldimethyl(4-vinylphenyl) phosphonate), poly(diethyl(4-vinylphenyl) phosphonate), poly(di(t-butyl)(4-vinylphenyl) phosphonate) and poly(t-butyl acrylate) are as follows.

-continued

R = methyl, ethyl, tert-butyl

For example, as poly(neopentyl styrene sulfonate) is changed to poly(styrene sulfonate) during the heat treatment, the star copolymer including polythiophene prepared as described above can be used as a conductive film material having superior conductivity and can maintain device stability well because the polythiophene and the poly(styrene sulfonate) are not dissolved well in organic solvents.

In accordance with the present disclosure, a star copolymer including a high-molecular-weight polythiophene having a three-dimensional structure and a polymer capable of providing by an external stimulus at least one dopant selected from a sulfonic acid group, a carboxylic acid group and a phosphoric acid group can be prepared. The polythiophene star copolymer provided by the present disclosure exhibits superior solubility and a film formed after coating exhibits high conductivity as at least one dopant selected from a sulfonic acid group, a carboxylic acid group and a phosphoric acid group is spontaneously generated by the polymer providing by an external stimulus at least one dopant selected from a sulfonic acid group, a carboxylic acid group and a phosphoric acid group and dopes the polythiophene. In addition, since the generated dopant is hydrophilic, the film exhibits high solvent resistance due to decreased solubility in organic solvents. Accordingly, the polythiophene star copolymer according to the present disclosure is a self-doped material to stably increase conductivity, and can be used as a superior conductive film material that can replace PEDOT:PSS used in a buffer layer (hole transfer layer) of an organic solar cell.

Hereinafter, the method for producing a polythiophene star polymer according to the present disclosure is described in detail. However, the following description is given only as a specific example and the present disclosure is not limited thereto.

Preparation of Atom Transfer Radical Polymerizable Poly (3-Alkylthiophene) Macroinitiator Preparation of poly(3-alkylthiophene) having allyl group or vinyl group at end A process of forming poly(3-alkylthiophene) having an allyl group or a vinyl group at an end by the GRIM method is described.

(1) Synthesis of 2,5-Dibromo-3-Alkylthiophene Monomer

[Scheme 1]

Referring to Scheme 1, a 3-alkylthiophene is synthesized by adding an alkyl magnesium bromide (alkyl-MgBr) as a Grignard reagent to a 3-bromothiophene monomer in the presence of a [1,3-bis(diphenylphosphine)propane]dichloronickel(11) (Ni(dppp)Cl$_2$) catalyst. Then, a 2,5-dibromo-3-alkylthiophene monomer is synthesized by adding N-bromosuccimide (NBS). The length of the alkyl group can be controlled by changing the Grignard reagent added to the 3-bromothiophene monomer.

(2) Preparation of Poly(3-Alkylthiophene) Having Allyl Group or Vinyl Group at End

[Scheme 2]

The synthesized 2,5-dibromo-3-alkylthiophene monomer is dissolved in dehydrated, deaerated tetrahydrofuran (THF) and then reacted with t-butyl-MgCl dissolved in dimethyl ether at room temperature under argon atmosphere. Subsequently, poly(3-alkylthiophene) is polymerized by adding Ni(dppp)Cl$_2$ as a catalyst and initiator and conducting reaction at room temperature. The molecular weight of poly(3-alkylthiophene) can be controlled by changing the amount of the added Ni(dppp)Cl$_2$.

For substitution at the end of the polymerized poly(3-alkylthiophene), polymerization is conducted by adding a Grignard reagent having an allyl group or a vinyl group (allyl-MgBr or vinyl-MgBr) and then the polymerization is quenched by adding methanol. The synthesized poly(3-alkylthiophene) is precipitated in methanol, extracted through a glass filter and purified by solvent extraction (Soxhlet method) using pentane to remove low-molecular-weight polymers, thereby preparing a poly(3-alkylthiophene) having an allyl group or a vinyl group introduced at an end.

Preparation of Atom Transfer Radical Polymerizable Poly (3-Alkylthiophene) Macroinitiator (1) Preparation of Poly(3-Alkylthiophene) Having Hydroxyl Group Introduced at End As described in Scheme 3, the poly(3-alkylthiophene) having an allyl group or a vinyl group at the end is dissolved sufficiently in dehydrated, deaerated THF and reaction is conducted at 40° C. under argon atmosphere after adding 10 equivalents of 9-borabicyclononane (9-BBN). Then, after adding 2 mL of a 6 M NaOH solution and conducting reaction, the reaction mixture is cooled to room temperature. When the temperature is lowered to room temperature, 2 mL of a 33% aqueous H$_2$O$_2$ solution is added and reaction is conducted at 40° C. Upon completion of reaction, the product is precipitated in a mixture of methanol and heavy water, extracted through a glass filter and purified by solvent extraction using methanol to unreacted reactants, thereby preparing a poly(3-alkylthiophene) having an end substituted with a hydroxypropyl group or a hydroxyethyl group.

(2) Preparation of Poly(3-Alkylthiophene) Having Halide Group Introduced at End

To replace the hydroxyl group of the poly(3-alkylthiophene) with the hydroxyl group introduced at the end with a halide group, the poly(3-alkylthiophene) having the hydroxypropyl group or the hydroxyethyl group substituted at the end is dissolved sufficiently in dehydrated, deaerated methylene chloride (MC) and reaction is conducted at 40° C. under argon atmosphere after adding triethylamine (TEA). Then, after adding a halide compound (R—X; X is Br or Cl), reaction is conducted at 40° C. Upon completion of reaction, the product is precipitated in methanol, extracted through a glass filter and purified by washing with methanol (MeOH), thereby preparing a poly(3-alkylthiophene) having a halide group introduced at the end.

Preparation of Polythiophene Star Copolymer Using Poly (3-Alkylthiophene) Macroinitiator and Poly(Neopentyl Styrene Sulfonate)

A star copolymer of polythiophene and poly(neopentyl sytrene) is polymerized in an oil bath maintained at about 80° C. by adding neopentyl styrene sulfonate, a crosslinking agent and a transition metal catalyst to the poly(3-alkylthiophene) macroinitiator. If necessary, a ligand or an additive may be further added.

Hereinafter, the present disclosure is described in more detail through examples. However, the following examples are given for the purpose of illustration only and the scope of the present disclosure is not limited thereby.

EXAMPLE 1

Preparation of poly(3-hexylthiophene) having allyl group at end: synthesis of 2,5-dibromo-3-hexylthiophene monomer and poly(3-hexylthiophene) having allyl group at end

3-Hexylthiophene was synthesized by adding 1.3 equivalent of hexylmagnesium bromide (hexyl-MgBr) to a 3-bromothiophene monomer in the presence of 0.0012 equivalent of [1,3-bis(diphenylphosphine)propane]dichloronickel(11) (Ni(dppp)Cl$_2$) catalyst. Then, a 2,5-dibromo-3-hexylthiophene monomer was synthesized by adding 2 equivalents of N-bromosuccimide (NBS).

The synthesized 2,5-dibromo-3-hexylthiophene monomer was dissolved in dehydrated, deaerated THF and then reacted with t-butyl-MgCl dissolved in dimethyl ether at room temperature under argon atmosphere for 2 hours. Subsequently, poly(3-hexylthiophene) was polymerized by adding 0.016 equivalent of Ni(dppp)Cl$_2$ as a catalyst and initiator and conducting reaction at room temperature for about 10 minutes.

To substitute the end of the polymerized poly(3-hexylthiophene) with an allyl group, reaction was conducted for about 2 minutes after adding 0.2 equivalent of allylmagnesium bromide (allyl-MgBr) as a Grignard reagent and the polymerization was terminated by adding methanol. The synthesized poly(3-hexylthiophene) (P3HT) was precipitated in methanol, extracted through a glass filter and purified by solvent extraction using pentane to remove low-molecular-weight polymers, thereby preparing P3HT having an allyl group introduced at the end.

2. Preparation of poly(3-hexylthiophene) macroinitiator: synthesis of poly(3-hexylthiophene) having hydroxyl group introduced at end and poly(3-alkylthiophene) having ECPA group introduced at end

[Scheme 6]

P3HT-Allyl 1. 9-BBN
2. NaOH/33% H$_2$O$_2$

In order to introduce a hydroxyl group at the end of the P3HT having the allyl group at the end, the P3HT having the allyl group was dissolved sufficiently in dehydrated, deaerated THF and then reaction was conducted at 40° C. under argon atmosphere for 24 hours after adding 10 equivalents of 9-borabicyclononane (9-BBN). Subsequently, after adding 2 mL of a 6 M NaOH solution and conducting reaction for 15 minutes, the reaction mixture was cooled to room temperature. When the temperature was lowered to room temperature, 2 mL of a 33% aqueous H$_2$O$_2$ solution was added and reaction was conducted at 40° C. for 12 hours. Upon completion of reaction, the product was precipitated in a mixture of methanol and heavy water, extracted through a glass filter and purified by solvent extraction using methanol to unreacted reactants.

In order to introduce an ECPA group at the end of the poly(3-alkylthiophene), the poly(3-alkylthiophene) having the hydroxyl group at the end was dissolved sufficiently in dehydrated, deaerated methylene chloride (MC) and then reaction was conducted under argon atmosphere at 40° C. for about 15 minutes after adding TEA. Upon completion of reaction, ECPA was added dropwise and poly(3-hexylthiophene) having an ECPA group at the end was prepared by conducting reaction at 40° C. for 12 hours. Subsequently, the product was precipitated in methanol, extracted through a glass filter and purified by washing with cold methanol (MeOH).

Figure 1:
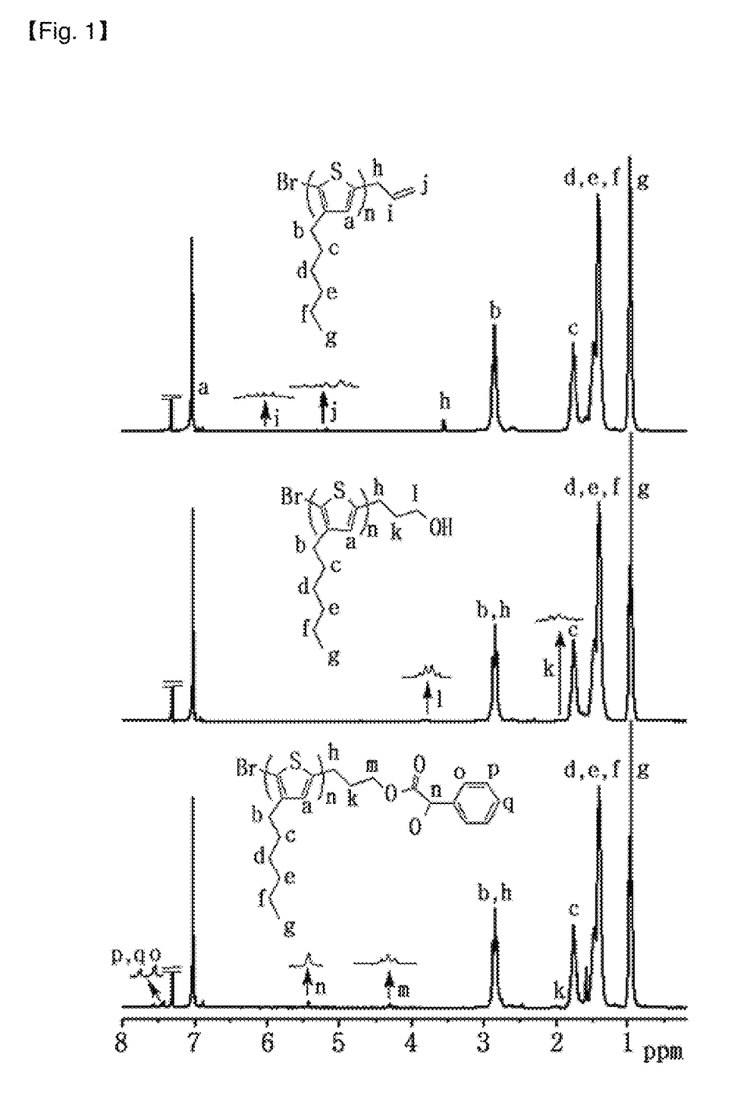
FIG. 1 shows $^1$H NMR spectra of the compounds produced during preparation of a poly(3-alkylthiophene) macroinitiator according to an exemplary embodiment of the present disclosure.

The structure of the produced poly(3-hexylthiophene) macroinitiator was analyzed by $^1$H NMR and the analysis result is shown in FIG. 1.

As can be seen from FIG. 1, the CH peak (a) of the poly(3-hexylthiophene) in the polythiophene star polymer was detected at 7.09-6.97 ppm, the CH$_2$ peaks (b, c, d, e, f) of the hexyl group were detected at 2.96-2.71 ppm, 1.851-1.662 ppm and 1.599-1.299 ppm, and the CH$_3$ peak (g) of the hexyl group was detected at 1.052-0.877 ppm. As for the allyl group, the CH peak was detected at 3.7 ppm, the CH peak of the double bond was detected at 36.1 ppm, and the CH$_2$ was detected at 5.3 ppm. As for the hydroxyl group, the CH$_2$ (k) peak was detected at 2.0 ppm and the CH$_2$ (l) peak was detected at 3.8 ppm. After substitution with the ATRP macroinitiator, the CH (n) peak was detected 5.4 ppm, the CH$_2$ (m) peak was detected 4.3 ppm, and the phenyl (C$_6$H$_5$) peak was detected 7.35-7.6 ppm.

3. Preparation of polythiophene star copolymer using poly(3-hexylthiophene) macroinitiator and poly(neopentyl styrene sulfonate)

[Scheme 7]

P3HT-MI

PNSS-MI

-continued

A star copolymer including polythiophene and poly(neopentyl styrene sulfonate) was polymerized in an oil bath maintained at about 80° C. after adding ethylene glycol dimethacrylate, $RuCl_2(PPh_3)_3$ and tributylamine to the poly(3-hexylthiophene) macroinitiator and poly(neopentyl styrene sulfonate) and dissolving using toluene. Subsequently, the star copolymer was obtained by removing the catalyst by precipitating in methanol and drying in vacuo at 40° C.

TEST EXAMPLE 1

Gel Permeation Chromatography (GPC) and Matrix-Assisted Laser Desorption Ionization (MALDI) Measurements In order to determine the degree of polymerization of the polythiophene star copolymer, the reaction solution was subjected to THF-GPC and MALDI measurements were conducted during the polymerization of the polythiophene star copolymer.

The molecular weight of PNSS determined by GPC was 3,700, the molecular weight of the P3HT determined by GPC was 16,000, and the absolute molecular weight determined by MALDI-TOF was 11,000.

Figure 2:
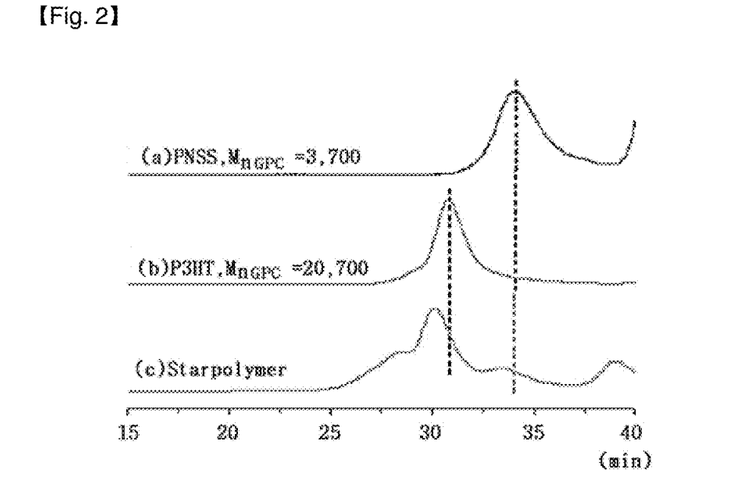
FIG. 2 shows $GPC_{THF}$ spectra of a reaction solution measured during polymerization of a polythiophene star copolymer according to an exemplary embodiment of the present disclosure.

FIG. 2 shows the THF-GPC analysis result of the poly(neopentyl styrene sulfonate) macroinitiator (a), the polythiophene macroinitiator (b) and the polythiophene star copolymer (c) including poly(neopentyl styrene sulfonate) obtained by conducting living radical polymerization for 10 hours using EGDMA as a crosslinking agent. Referring to FIG. 2, the preparation of the star copolymer was confirmed from the shifting of the peaks of the poly(neopentyl styrene sulfonate) macroinitiator (a) and the polythiophene macroinitiator (b). That is to say, it was confirmed that the molecular weight was increased with reaction time.

TEST EXAMPLE 2

$^1H$ NMR Measurement Before Heat Treatment of Polythiophene Star Copolymer

Figure 3:
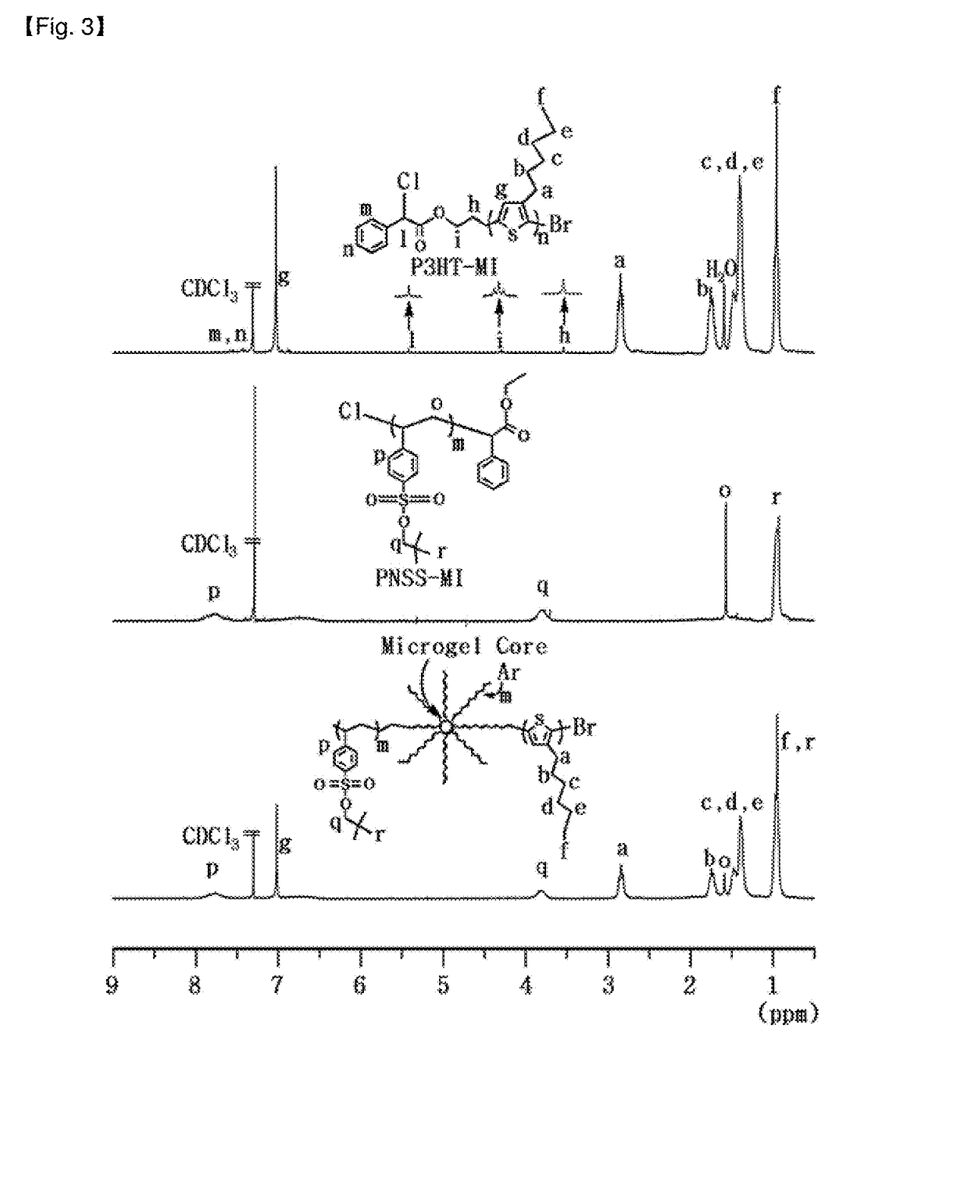
FIG. 3 shows $^1$H NMR spectra of a poly(3-alkylthiophene) macroinitiator, a poly(neopentyl sulfonate) polymer initiator and a polythiophene star copolymer obtained from the two initiators using a divinyl compound, according to an exemplary embodiment of the present disclosure.

The star copolymer of polythiophene and poly(neopentyl styrene sulfonate) was subjected to $^1H$ NMR measurement and the result is shown in FIG. 3.

FIG. 3 shows the $^1H$ NMR analysis result of the poly(neopentyl styrene sulfonate) macroinitiator (a), the polythiophene macroinitiator (b) and the polythiophene star copolymer (c) including poly(neopentyl styrene sulfonate) obtained by conducting living radical polymerization for 10 hours using EGDMA as a crosslinking agent. As can be seen from FIG. 3, the CH peak (a) of the poly(3-hexylthiophene) of the polythiophene star polymer was detected at 7.09-6.97 ppm, the $CH_2$ peaks (b, c, d, e, f) of the hexyl group were detected at 2.96-2.71 ppm, 1.851-1.662 ppm and 1.599-1.299 ppm, and the $CH_3$ (g) of the hexyl group was detected at 1.052-0.877 ppm. After substitution with the ATRP macroinitiator, the CH (n) peak was detected at 5.4 ppm, the $CH_2$ (m) peak was detected at 4.3 ppm, and the phenyl ($C_6H_5$) peak was detected at 7.35-7.6 ppm. As for the poly(neopentyl styrene) macroinitiator, the phenyl ($C_6H_5$) peak was detected at 7.5-8 ppm, the $CH_2$ peak of the neopentyl group was detected at 3.9 ppm, and the $CH_3$ peak of the neopentyl group was detected at 1.1-0.9 ppm. After the star polymer was prepared by ATRP, both the two macroinitiator peaks could be detected due to the presence of each hetero arm.

TEST EXAMPLE 3

FT-IR Measurement after Heat Treatment of Polythiophene Star Copolymer

Figure 4:
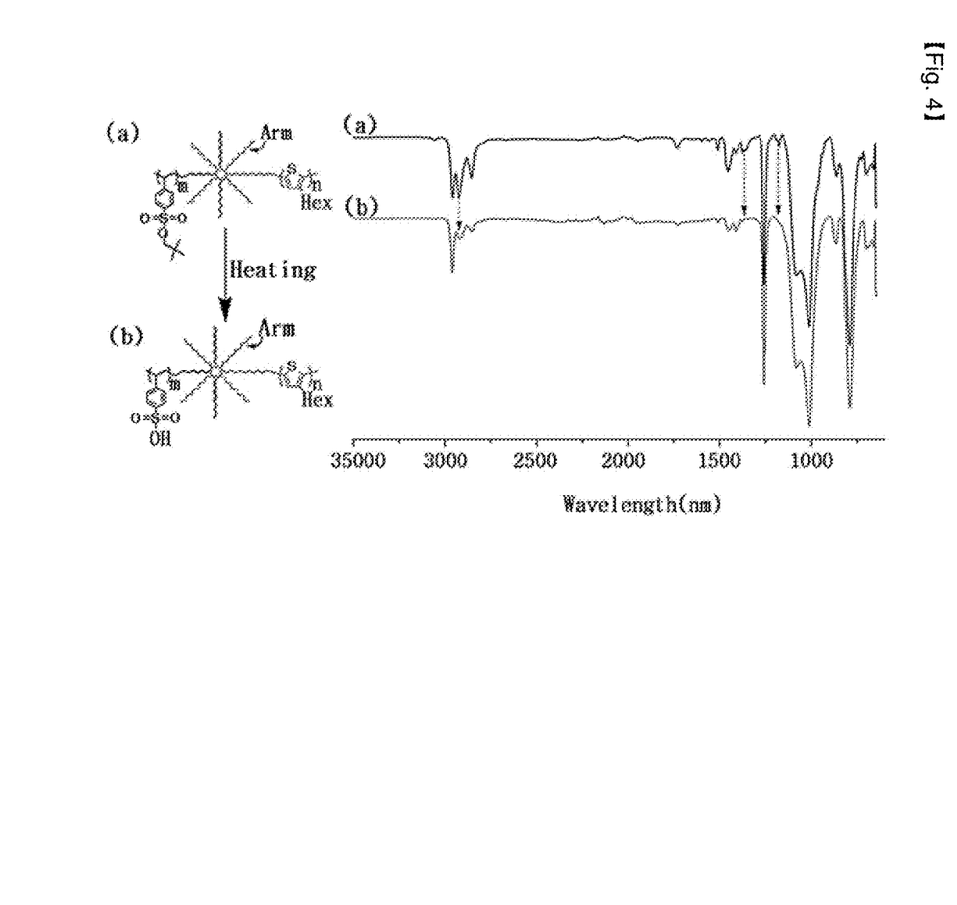
FIG. 4 shows a result of FT-IR measurement before and after heat treatment of a polythiophene star copolymer according to an exemplary embodiment of the present disclosure. The disappearance of a neopentyl group protecting a sulfonate group can be confirmed.

The star copolymer of polythiophene and poly(neopentyl styrene sulfonate) was subjected to FT-IR measurement and the result is shown in FIG. 4. As can be seen from FIG. 4, it was confirmed from the FT-IR measurement that, when the polythiophene star copolymer including the poly(neopentyl styrene sulfonate) was heat-treated at 150° C. for an hour, the neopentyl group of the poly(neopentyl styrene sulfonate) was broken down by heat. Also, it was confirmed the alkyl group of the sulfonic acid group was replaced with hydrogen after the heat treatment, leading to formation of the sulfonate group. In addition, the decrease in the neopentyl peaks at 2920 $cm^{-1}$ and 1180 $cm^{-1}$ and the appearance of the sulfonate peak at 1340 $cm^{-1}$ could be identified.

TEST EXAMPLE 4

Conductivity Measurement

The star copolymer of polythiophene and poly(neopentyl styrene sulfonate) was coated on a Si wafer or an ITO substrate and, following heat treatment at 160° C. for 1-2 hours, conductivity was measured after depositing a metal electrode. For comparison, the conductivity of the currently used PEDOT:PSS was measured in the same manner. The result is shown in Table 1.

As can be seen from Table 1, the star copolymer according to the present disclosure showed better conductivity than PEDOT:PSS.

TABLE 1

|  | Conductivity | Thickness | Ref |
| --- | --- | --- | --- |
| PEDOT:PSS | 0.9-1.15 S/cm | 28 nm | 0.6 S/cm |
| Star polymer | 4.6-5.2 S/cm | 55 nm |  |

TEST EXAMPLE 5

I-V Measurement

Figure 5:
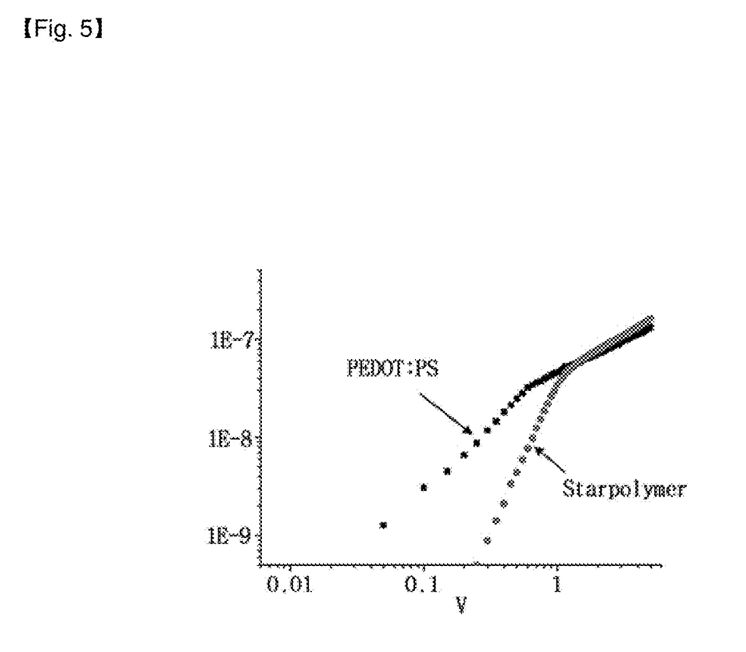
FIG. 5 shows a result of I-V measurement of a device using a polythiophene star copolymer according to an exemplary embodiment of the present disclosure.

The star copolymer of polythiophene and poly(neopentyl styrene sulfonate) star copolymer was spin coated on a Si wafer and a sulfonate group was introduced by heat-treating at 150° C. for 1 hour. After depositing a gold electrode on the polythiophene star copolymer film with the sulfonate group introduced, conductivity was measured using an I-V curve. The result is shown in FIG. 5. The following equations were used.

$$G = I/V$$

$$\sigma = kG \, (k = d/A) \, (\sigma; \text{conductivity})$$

TEST EXAMPLE 6

Solubility Measurement

A conductive thin film coated with the star copolymer of polythiophene and poly(neopentyl styrene sulfonate) star copolymer was subjected to solubility measurement. For comparison, a thin film coated with general polythiophene was used. The result is shown in FIG. 6 ((a): comparative example, (b): example).

Figure 6:
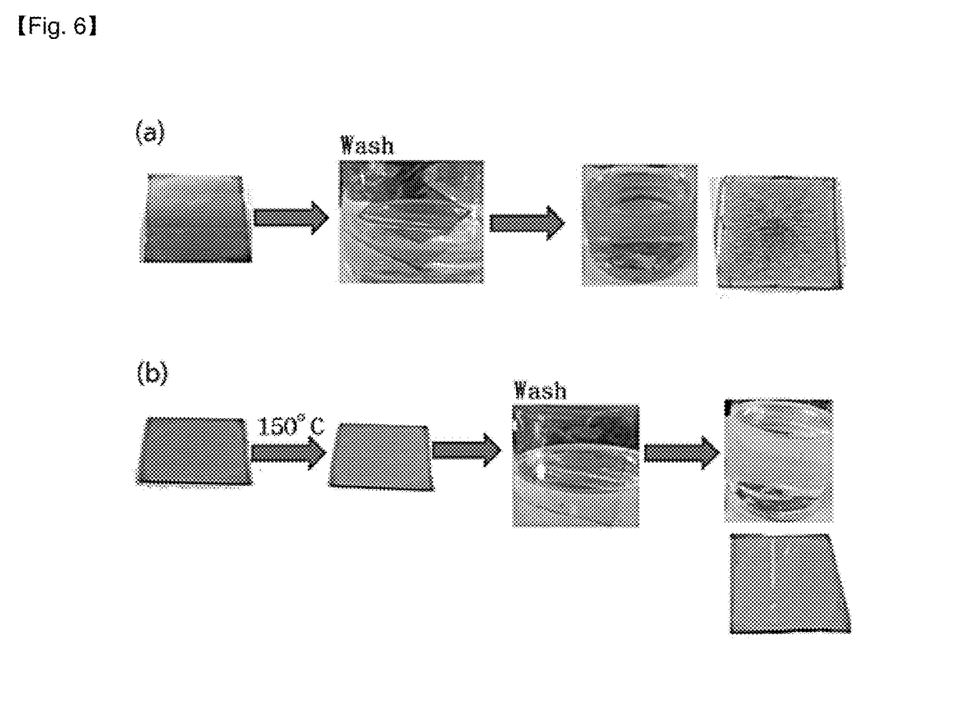
FIG. 6 shows a result of testing the solubility of a conductive thin film using a polythiophene star copolymer according to an exemplary embodiment of the present disclosure.

As can be seen from FIG. 6, when the general polythiophene was used (a), the polythiophene was washed off by a solvent such as THF or chloroform since the polythiophene was dissolved by the solvent. In contrast, when the polythiophene star copolymer containing the poly(neopentyl styrene sulfonate) was coated and heat-treated (b), the film exhibited resistance to the organic solvent THF or chloroform since the polythiophene star copolymer was not dissolved by the solvent. Whereas the general polythiophene thin film showed peeling of the coat layer when washed with the organic solvent, the star copolymer thin film according to the present disclosure remained without being dissolved when washed with the organic solvent. Accordingly, it was confirmed that the star copolymer thin film according to the present disclosure exhibits decreased solubility in organic solvents after heat treatment.

The invention claimed is:
1. A polythiophene star copolymer capable of being self-doped by an external stimulus, comprising:
a microgel core comprising a homopolymer of a divinyl monomer or a copolymer of two or more divinyl monomers;
polythiophene or derivative thereof bonded to the core; and
a hetero arm chain comprising a polymer including at least one dopant selected from a group consisting of a sulfonic acid group, a carboxylic acid group and a phosphoric acid group,
wherein the polymer including at least one dopant is at least one selected from a group consisting of poly (neopentyl styrene sulfonate), poly(t-butyldimethyl(4-vinylphenyl) phosphonate), poly(diethyl(4-vinylphenyl) phosphonate), poly(di(t-butyl)(4-vinylphenyl) phosphonate) and poly(t-butyl acrylate), and
wherein the polythiophene or the derivative thereof is represented by a chemical formula selected from a group consisting of Chemical Formula 1, Chemical Formula 2 and Chemical Formula 3:

[Chemical Formula 1]

wherein n is an integer from 0 to 12 and m is an integer from 1 to 90

[Chemical Formula 2]

wherein m is an integer from 1 to 90, R' is $-C_nH_{2n+1}$ and n is an integer from 1 to 12

[Chemical Formula 3]

wherein m is an integer from 1 to 90, $R_1$ and $R_2$ are selected from the R in Chemical Formula 2, and $R_1$ and $R_2$ may be identical or different.

2. The polythiophene star copolymer according to claim 1, wherein the divinyl monomer is at least one selected from a group consisting of a diacrylate compound, an ethylene glycol dimethacrylate compound, a diacrylamide compound, a divinylphenyl compound, a divinylnaphthalene compound and a divinyltoluene compound.

3. A method for producing a polythiophene star copolymer according to claim 1 comprising:
   forming a polythiophene macroinitiator made by introducing a living radical polymerizable functional group into an end of polythiophene or a derivative thereof;
   forming through living radical polymerization a polymer macroinitiator for providing by an external stimulus at least one dopant selected from a group consisting of a sulfonic acid group, a carboxylic acid group and a phosphoric acid group; and
   polymerizing the polythiophene macroinitiator added with the polymer macroinitiator and at least one kind of divinyl monomer to produce the polythiophene star copolymer,
   wherein the polythiophene star copolymer comprises: a microgel core comprising a homopolymer of a divinyl monomer or a copolymer of two or more divinyl monomers; polythiophene or a derivative thereof bonded to the core; and a hetero arm chain comprising a polymer providing by an external stimulus at least one dopant selected from a group consisting of a sulfonic acid group, a carboxylic acid group and a phosphoric acid group.

4. The method for producing a polythiophene star copolymer according to claim 3, wherein the polymer macroinitiator is obtained by introducing at least one selected from a group consisting of an atom transfer radical polymerization (ATRP) macroinitiator, a nitroxide-mediated polymerization (NMP) macroinitiator and a reversible addition-fragmentation chain transfer (RAFT) macroinitiator into at least one selected from a group consisting of poly(neopentyl styrene sulfonate), poly(t-butyldimethyl(4-vinylphenyl) phosphonate), poly(diethyl(4-vinylphenyl) phosphonate), poly(di(t-butyl)(4-vinylphenyl) phosphonate) and poly(t-butyl acrylate).

5. The method for producing a polythiophene star copolymer according to claim 1, wherein the divinyl monomer is at least one selected from a group consisting of a diacrylate compound, an ethylene glycol dimethacrylate compound, a diacrylamide compound, a divinylphenyl compound, a divinylnaphthalene compound, and a divinyltoluene compound.

6. A method for producing a conductive film using a polythiophene star copolymer according to claim 1 comprising:
   providing a substrate;
   coating the substrate with the polythiophene star copolymer; and
   post-treating the substrate with at least one selected from heat, light and an acidic chemical.

7. The method for producing a conductive thin film according to claim 6, wherein the substrate is surface-treated by at least one method selected from a group consisting of piranha solution treatment, acid treatment, base treatment, plasma treatment, atmospheric pressure plasma treatment, ozone treatment, UV treatment and polymer or single molecule coating.

8. The method for producing a conductive thin film according to claim 6, wherein the heat treatment as the post-treating is conducted at 150-250° C.

9. A composition for coating a substrate, comprising the polythiophene star copolymer according to claim 1.

* * * * *